United States Patent
Park

(10) Patent No.: US 9,578,752 B2
(45) Date of Patent: Feb. 21, 2017

(54) METHOD OF FORMING CONDUCTIVE PATTERN AND SUBSTRATE HAVING CONDUCTIVE PATTERN MANUFACTURED BY THE SAME METHOD

(75) Inventor: Jung-Ho Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 639 days.

(21) Appl. No.: 12/701,278

(22) Filed: Feb. 5, 2010

(65) Prior Publication Data

US 2010/0193224 A1 Aug. 5, 2010

(30) Foreign Application Priority Data

Feb. 5, 2009 (KR) .................. 10-2009-0009355

(51) Int. Cl.
- B05D 5/12 (2006.01)
- H05K 3/24 (2006.01)
- H05K 3/12 (2006.01)

(52) U.S. Cl.
CPC ............ *H05K 3/245* (2013.01); *H05K 3/1283* (2013.01); *H05K 2203/1131* (2013.01); *H05K 2203/121* (2013.01)

(58) Field of Classification Search
USPC ....................................................... 427/97.1
See application file for complete search history.

(56) References Cited

U.S. PATENT DOCUMENTS

| | | | |
|---|---|---|---|
| 5,132,248 A * | 7/1992 | Drummond et al. ......... | 505/325 |
| 5,882,722 A * | 3/1999 | Kydd .......................... | 427/98.4 |
| 6,379,745 B1 | 4/2002 | Kydd et al. | |
| 7,115,218 B2 | 10/2006 | Kydd et al. | |
| 7,510,951 B2 | 3/2009 | Shin et al. | |
| 7,683,107 B2 | 3/2010 | Yang | |

(Continued)

FOREIGN PATENT DOCUMENTS

| | | |
|---|---|---|
| JP | 2001-515645 A1 | 9/2001 |
| JP | 2004-534362 A | 11/2004 |

(Continued)

OTHER PUBLICATIONS

Curtis et al. (Metallizations by direct-write inkjet printing) Oct. 2001.*

(Continued)

*Primary Examiner* — Austin Murata
(74) *Attorney, Agent, or Firm* — Rothwell, Figg, Ernst & Manbeck, P.C.

(57) ABSTRACT

The present invention relates to a method for manufacturing a board that includes a conductive pattern, which comprises the steps of 1) discharging a conductive inorganic composition that includes a conductive inorganic metal particle on a substrate; 2) discharging a conductive organic composition that includes a conductive organic metal complex on the conductive inorganic composition; and 3) sintering the conductive inorganic composition and the conductive organic composition, and a board that includes a conductive pattern manufactured by using the same. A board that includes a conductive pattern according to the present invention may have high conductivity even though it is sintered at a lower sintering temperature than a board that includes a conductive pattern formed by using only an organic material or only an inorganic material.

11 Claims, 5 Drawing Sheets

(56) References Cited

U.S. PATENT DOCUMENTS

| | | | |
|---|---|---|---|
| 2002/0167064 A1* | 11/2002 | Takeyama et al. | 257/459 |
| 2003/0213614 A1* | 11/2003 | Furusawa et al. | 174/256 |
| 2005/0079707 A1* | 4/2005 | Tsukahara et al. | 438/660 |
| 2005/0173680 A1 | 8/2005 | Yang | |
| 2005/0176246 A1 | 8/2005 | Yang | |
| 2006/0118233 A1* | 6/2006 | Wargo | H05K 3/1258 156/247 |
| 2006/0261316 A1* | 11/2006 | Jun et al. | 252/500 |
| 2010/0065790 A1* | 3/2010 | Dietz | C09J 9/02 252/514 |
| 2010/0261031 A1 | 10/2010 | Chung et al. | |

FOREIGN PATENT DOCUMENTS

| | | |
|---|---|---|
| JP | 2005-223323 A | 8/2005 |
| JP | 2005-223324 A | 8/2005 |
| JP | 2005-229109 A | 8/2005 |
| JP | 2006-108129 A | 4/2006 |
| JP | 2008-198595 A | 8/2008 |
| JP | 2008-544479 A | 12/2008 |
| JP | 2010-500476 A | 1/2010 |
| KR | 10-2009-0012696 A | 2/2009 |

OTHER PUBLICATIONS

Japanese Office Action from JP Appln. No. 2010-024122, dated Apr. 3, 2012, 4 pages.

* cited by examiner

METHOD OF FORMING CONDUCTIVE PATTERN AND SUBSTRATE HAVING CONDUCTIVE PATTERN MANUFACTURED BY THE SAME METHOD

CROSS REFERENCE TO RELATED APPLICATIONS

This application claims priority from Korean patent application No. 10-2009-0009355 filed on Feb. 5, 2009, all of which is incorporated herein by reference in its entirety for all purposes.

BACKGROUND OF THE INVENTION

1. Field of the Invention

The present invention relates to a method for manufacturing a board that includes a conductive pattern capable of obtaining high conductivity at a low sintering temperature, and a board that includes a conductive pattern that is manufactured by using the same.

2. Description of the Related Art

In a transparent substrate for display and a circuit board for electronic parts that are currently used, it is essentially required to form a conductive pattern. The conductive pattern is formed by mainly a photosensitive paste method or a photo etching method.

The photosensitive paste method includes the steps of coating a photosensitive paste on a substrate by using a screen printer, exposing UV using a photomask, and etching it by using an alkaline aqueous solution. A portion that is subjected to UV exposure by a photomask is not etched by an alkali aqueous solution because of photocrosslinking, and a portion that is not subjected to UV exposure is etched by an alkali aqueous solution because photocrosslinking is not carried out, such that an electrode pattern is formed. However, the forming of the electrode pattern by using the photosensitive electrode paste is disadvantageous in that it is difficult to control the degree of precision of a pitch and a width of the electrode.

In addition, the forming of the electrode pattern by using the photolithography method is mainly carried out by a process for entirely coating the electrode on the substrate or depositing the electrode on the substrate, and etching it. However, the photolithography method has problems in that a process time of depositing the electrode on the entire surface of the substrate, and costs of devices and materials are high while a thin film is formed, and there is an environmental contamination while etching is carried out.

Therefore, currently, as compared to the screen printing method or the photolithography method, an inkjet printing technology in which a mask is not required to form a fine pattern, it is not affected by the size of the board which will be printed, a printing time is short, and there is no problem in terms of environmental contamination is suggested.

The inkjet printing is a non-contact patterning technology in which a solution or a suspension solution is sprayed in drops of several to tens PL (pico liter) through a fine nozzle, and is advantageous in that the printing is freely carried out with a tens micrometer resolution.

Therefore, a technology in which a conductive pattern is formed on a substrate by using the inkjet printing is suggested. The conductivity of the conductive pattern that is formed on the substrate depends on the content of the metal particle included in the conductive ink composition, and in the case of when it is an ink that is generally used as a wire, the content of the metal particle in the conductive ink composition is in the range of 50 to 60 wt %. When the concentration of the metal particle is increased, the conductivity is increased, but since a reduction in dispersion property occurs according to this, there is a problem in stability of the conductive ink composition.

In general, if after the conductive ink composition that includes the inorganic metal particle is discharged to the substrate by using an inkjet printing method, a sintering process is carried out, 1) a solvent and an additive are removed, 2) melting occurs on the surface of the inorganic metal particle, and 3) the melted particle surfaces are fused, thereby causing necking between the inorganic metal particles. Through this process, a conductive pattern that includes the inorganic metal particles is formed. When the size of the inorganic metal particle that is used in the conductive ink composition is small, a sintering temperature is rapidly lowered, and in the case of when the particles having the size of about 50 nm, the conductivity can be shown at about 200° C. in the sintering process. However, as the method for reducing the size of the metal particle, in general, the sintering temperature of the conductive ink composition using the inorganic metal particles is determined at the temperature range of 200 to 300° C.

Meanwhile, in the case of the conductive ink composition that includes the organic metal particle, unlike the conductive ink composition that includes the inorganic metal particle, since metal particlization is carried out through a reduction process at a low temperature, the conductivity can be shown at the relatively low sintering temperature of about 150° C. However, in the case of the conductive ink composition that includes the organic metal particle, since the content of the metal is lower than that of the conductive ink composition that includes the inorganic ink, there are disadvantages in that the conductivity is low.

SUMMARY OF THE INVENTION

The present invention has been made to overcome the above problems in the related art, and it is an object of the present invention to provide a method for manufacturing a board that includes a conductive pattern having high conductivity even though it is manufactured at a low sintering temperature, and a board that includes the conductive pattern that is manufactured by using the same.

In order to accomplish the above object, the present invention provides a method for manufacturing a board that includes a conductive pattern, which comprises the steps of 1) discharging a conductive inorganic composition that includes a conductive inorganic metal particle on a substrate; 2) discharging a conductive organic composition that includes a conductive organic metal complex on the conductive inorganic composition; and 3) sintering the conductive inorganic composition and the conductive organic composition.

In addition, the present invention provides a board including a conductive pattern which comprises a substrate; and an organic metal complex that is provided on the substrate and provides a conductive channel between a conductive inorganic metal particle and at least a portion of conductive inorganic metal particle.

In addition, the present invention provides a board that includes the conductive pattern manufactured by using the method for manufacturing the board that includes the conductive pattern.

In addition, the present invention provides a transparent board, a printed circuit board, or a flexible printed circuit board that includes the board that includes the conductive pattern.

A board that includes a conductive pattern according to the present invention may have high conductivity even though it is sintered at a lower sintering temperature than a board that includes a conductive pattern formed by using only an organic material or only an inorganic material, and may reduce a cost through a simplification of a process.

DETAILED DESCRIPTION OF THE PREFERRED EMBODIMENTS

Hereinafter, the present invention will be described in more detail.

The present invention provides a method for manufacturing a board that includes a conductive pattern, which comprises the steps of 1) discharging a conductive inorganic composition that includes a conductive inorganic metal particle on a substrate; 2) discharging a conductive organic composition that includes a conductive organic metal complex on the conductive inorganic composition; and 3) sintering the conductive inorganic composition and the conductive organic composition.

Figure 1:
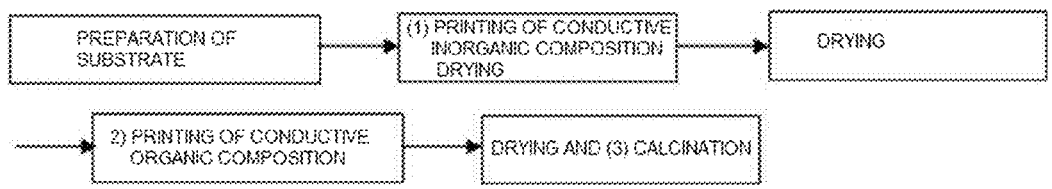
FIG. 1 is a schematic view that illustrates a method for manufacturing a board that includes a conductive pattern according to the present invention.

FIG. 1 is a schematic view that illustrates a method for manufacturing a board that includes a conductive pattern according to the present invention. FIG. 1 illustrates an additional process step such as drying and the like in addition to a method for manufacturing a board that includes a conductive pattern, which includes the steps (1) to (3).

The substrate may be a glass substrate, a transparent polymer substrate or a flexible substrate, and if it is a board that is used as a conductive board in the art, it is not particularly limited.

Figure 2:
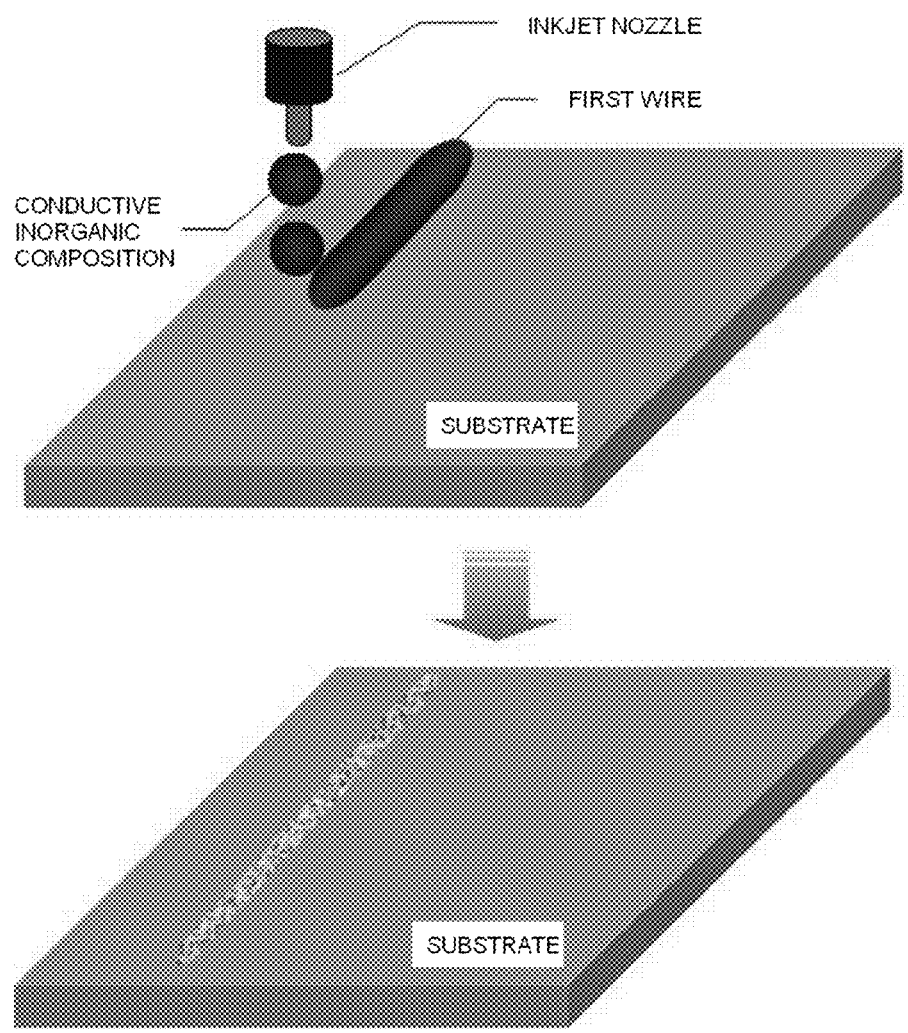
FIG. 2 is a view that illustrates a step for discharging a conductive inorganic composition according to the present invention by using an inkjet printing method.

The step 1) is a step for discharging a conductive inorganic composition that includes the conductive inorganic metal particle on the substrate, and it is preferable that the discharging of the conductive inorganic composition is carried out by using an inkjet method. FIG. 2 is a schematic view that illustrates a step for discharging the inorganic composition.

It is preferable that the conductive inorganic composition including the conductive inorganic metal particle includes a conductive inorganic metal particle and a solvent.

As the conductive inorganic metal particle, one or more that are selected from the group consisting of Ag, Au, Pt, Ni, Pd, and Cu may be used, but it is not limited thereto.

It is preferable that the conductive inorganic metal particle is a nanosized spherical particle that has a particle diameter of 1000 nm or less, and it is more preferable that the particle diameter is in the range of 0 to 100 nm. In the case of when the particle diameter of the conductive inorganic particle is more than 1000 nm, a sintering temperature may be rapidly increased. In addition, in the case of when a needle-shaped conductive inorganic metal particle in which an aspect ratio of the particle is large is used, there are problems in that dispersibility is lowered and a nozzle is clogged.

The conductive inorganic metal particle is included in an amount of preferably 10 to 90 wt % on the basis of the total weight of the conductive inorganic composition, and more preferably 30 to 70 wt %. In the case of when the content of the inorganic metal particle is less than 10 wt %, it is difficult to show the sufficient conductivity, and in the case of when the content is more than 90 wt %, since the viscosity of the ink is increased, a nozzle is clogged, thus causing a problem in terms of jetting property.

As the above solvent, the solvents that are known in the art may be used without a limit. As detailed examples thereof, there are one or more that are selected from the group consisting of propylene glycol propyl ether, ethylene glycol and glycerol, but they are not limited thereto.

It is preferable that the solvent is included in an amount of 10 to 90 wt % on the basis of the total weight of the conductive inorganic composition that includes the inorganic metal particle. In the case of when the content of the solvent is less than 10 wt %, since the viscosity of the ink is increased, a nozzle is clogged, thus causing a problem in terms of jetting property, and in the case of when the content is more than 90 wt %, since the particle content in the composition is lowered, there are problems in that the conductivity is lowered or a wire is broken.

The inorganic metal ink composition may further include a dispersing agent or an additive such as a surfactant.

As detailed examples of the dispersing agent, one or more polymer materials that are selected from the group consisting of polyvinylpyrrolidone (PVP), polyethyleneimine (PEI), polymethyl vinyl ether (PMVE), polyvinyl alcohol (PVA), polyoxyethylene alkyl phenyl ether, polyoxyethylene sorbitan monostearate and a derivative thereof may be used, but they are not limited thereto.

As detailed examples of the surfactant, a fluorine surfactant, a silicon surfactant and the like may be used, but they are not limited thereto.

It is preferable that the additive is included in an amount of 0.1 to 5 wt % on the basis of the total weight of the conductive organic composition that includes the inorganic metal particle.

Figure 4:
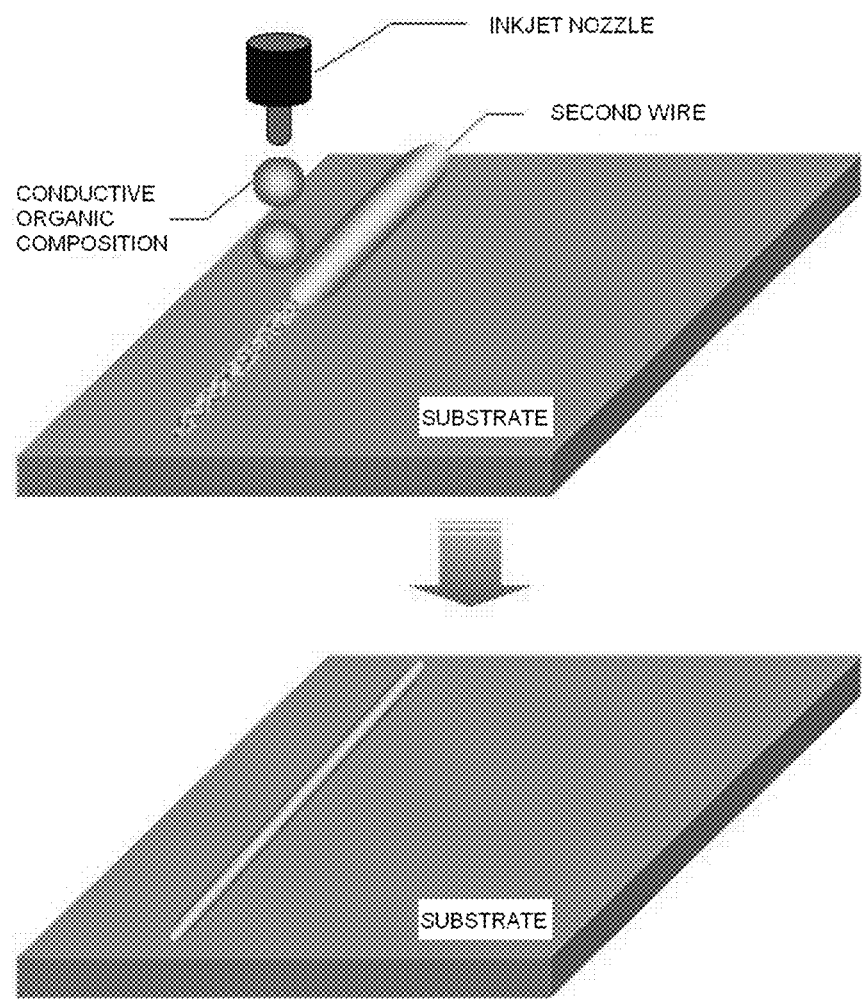
FIG. 4 is a view that illustrates a step for discharging a conductive inorganic composition according to the present invention by using an inkjet printing method.

The step 2) is a step for discharging a conductive inorganic composition on the conductive inorganic composition of the step 1), and it is preferable that the discharging of the conductive organic composition is carried out by using an inkjet printing method. FIG. 4 is a schematic view that illustrates a step for discharging the conductive organic composition on the conductive inorganic composition.

It is preferable that the conductive organic composition includes an organic metal complex and a solvent.

As the organic metal complex, Ag alkanoate such as Ag neodecanoate, Ag neotetradecanoate or Ag neohexadecanoate may be used, but it is not limited thereto.

It is preferable that the organic metal complex is included in an amount of 10 to 90 wt % on the basis of the total weight of the conductive organic composition.

In the case of when the content of the organic metal particle is less than 10 wt %, it is difficult to show the sufficient conductivity, and in the case of when the content is more than 90 wt %, since the dispersibility is lowered, the precipitation of the organic metal complex in the conductive organic composition may occur.

As the organic solvent, there is no particular limit, but one or more that are selected from the group consisting of hydrocarbon solvents such as xylene, toluene, benzene and the like may be used.

The conductive organic composition may further include an additive such as the surfactant and the like.

As detailed examples of the surfactant, a fluorine surfactant, a silicon surfactant and the like may be used, but they are not limited thereto.

It is preferable that the additive is included in an amount of 0.1 to 5 wt % on the basis of the total weight of the conductive organic composition that includes the organic metal complex.

Figure 5:
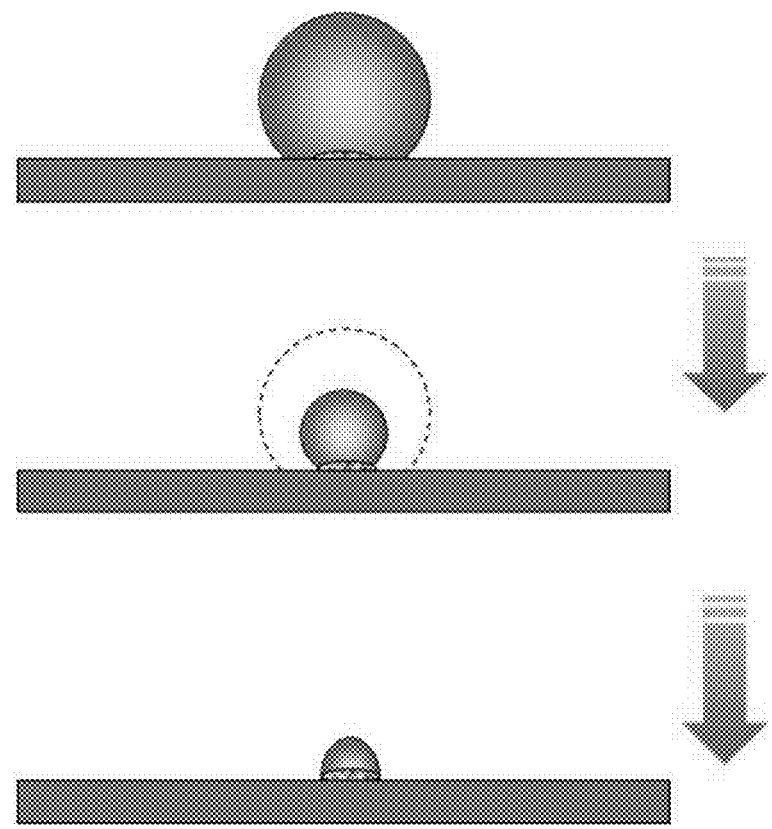
FIG. 5 illustrates a step for sintering an inorganic pattern and the conductive organic composition that is discharged on the inorganic pattern.

The step 3) is a step for sintering the conductive inorganic composition and conductive organic composition discharged in the step 1) and step 2). FIG. 5 is a schematic view that illustrates a step for discharging the conductive organic composition on the conductive inorganic composition.

The sintering is carried out preferably at 250° C. or less for 1 to 120 min, and more preferably at 100 to 200° C. for 5 to 60 min. In the case of when the sintering temperature is more than 250° C., the conductive organic composition may be thermally decomposed.

In order to remove a volatile solvent in the organic pattern before the sintering of the step 3), a drying step may be further carried out. It is preferable that the drying is carried out at 25 to 100° C. for 5 to 30 min.

The method for manufacturing the board that includes the conductive pattern according to the present invention may further include before the conductive organic composition of the step 2) is discharged, in order to remove the solvent in the conductive inorganic composition, drying the conductive inorganic composition that is discharged in the step 1).

Figure 3:
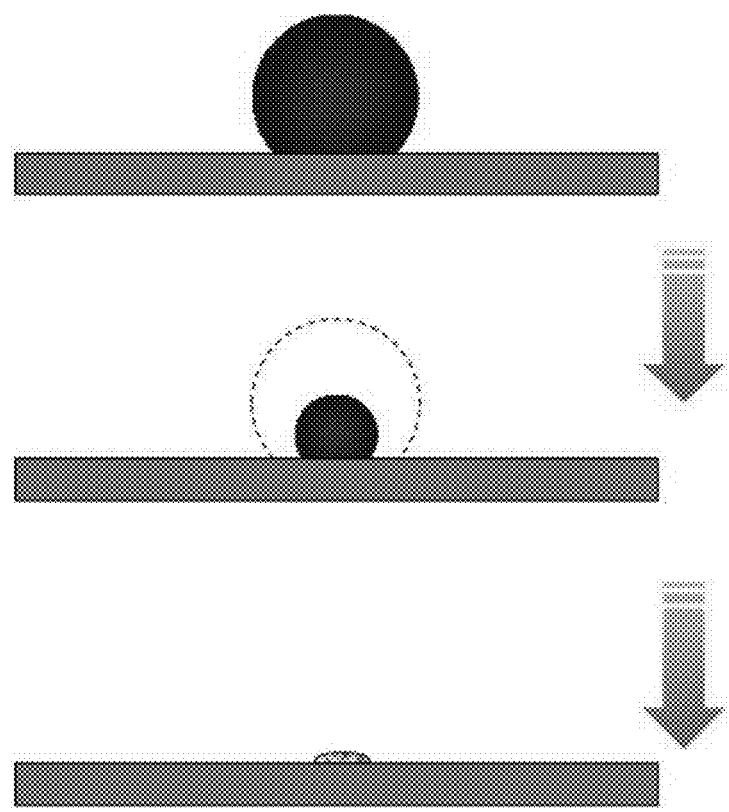
FIG. 3 is a view that illustrates a step for drying the discharged conductive inorganic composition according to the present invention.

It is preferable that the conductive inorganic composition that is discharged in the step 1) is dried at 100 to 150° C. for 10 to 60 min. FIG. 3 is a schematic view that illustrates a step for drying the discharged conductive inorganic composition.

In addition, the method for manufacturing the board that includes the conductive pattern according to the present invention may further include before the conductive inorganic composition discharged on the board of the step 3) is sintered, in order to remove the solvent in the conductive organic composition, drying the conductive organic composition that is discharged in the step 2).

It is preferable that the conductive organic composition that is discharged in the step 2) is dried at 25 to 150° C. for 5 to 30 min.

In addition, in the case of when a plurality of inkjet heads are used in the present invention, the conductive inorganic composition and the conductive organic composition of the step 1) and the step 2) may be simultaneously discharged.

In addition, the present invention provides a board including a conductive pattern that comprises a substrate; and an organic metal complex that is provided on the substrate and provides a conductive channel between a conductive inorganic metal particle and at least a portion of conductive inorganic metal particle.

The board that includes the conductive pattern may further include according to the discharge amount of the conductive organic composition that includes the organic metal complex a pattern layer that includes the conductive organic metal complex on the conductive pattern that includes the organic metal complex and provides the conductive channel between the conductive inorganic metal particle and at least a portion of the conductive inorganic metal particle.

In addition, the present invention provides a board that includes the conductive pattern manufactured according to the method for manufacturing the board that includes the conductive pattern.

Figure 6:
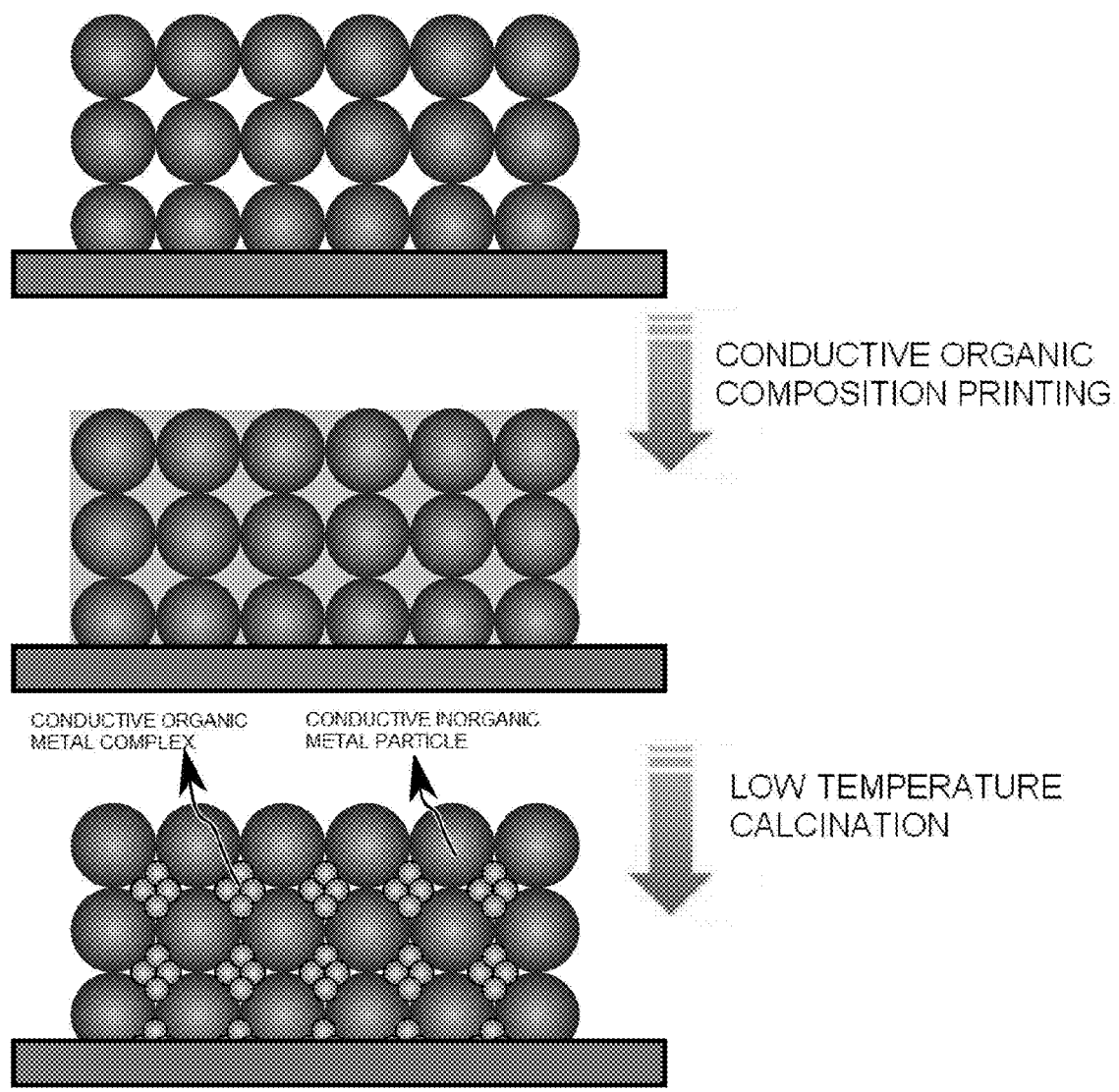
FIG. 6 is a schematic view that illustrates an operation principle of high conductivity at a low sintering temperature of the present invention.

The board that includes the conductive pattern may provide the high conductivity at a lower sintering temperature than the case of when only the conductive organic or inorganic composition is used by discharging the conductive inorganic composition that has the low resistance by using the inkjet printing method and discharging the conductive organic composition that shows the conductivity at a low temperature so that the organic particles of the conductive organic composition are filled between the metal particles of the conductive inorganic composition that does not form necking at a low temperature. FIG. 6 is a schematic view that illustrates an operation principle showing the high conductivity at a low sintering temperature of the present invention.

In addition, the present invention provides a transparent board, a printed circuit board or a flexible printed circuit board that includes the board including the conductive pattern.

As described above, even though the conductive pattern according to the present invention is manufactured at the low sintering temperature, since the high conductivity may be shown, the boards that are made of various materials such as glass and plastics may be used.

Hereinafter, the present invention will be described in more detail by using the following Examples and Comparative Examples. However, the following Examples are set forth to illustrate but are not to be construed to limit the present invention.

Example 1

The conductive inorganic composition that included 5 g of Ag NP (nanoparticle) that was the inorganic metal particle and had the particle diameter of 30 nm, 3.5 g of propylene glycol propyl ether as the solvent, 1.25 g of ethylene glycol, and 0.25 g of glycerol was manufactured, and discharged on the glass substrate by using the ink method. The discharged conductive inorganic composition was dried at 100° C. for 10 min to manufacture the inorganic pattern. After that, the conductive organic composition that included 4 g of the Ag nanodecanoate as the organic metal complex and 6 g of xylene as the solvent was manufactured, and discharged on the inorganic pattern that was formed by using the inkjet method. After that, it was sintered at 175° C. for 1 hour, thereby manufacturing the board that included the conductive pattern including the conductive inorganic material and the conductive organic material.

The resistance of the board that included the conductive pattern was measured through the 4-point probe, and the result was 176Ω.

Comparative Example 1

The conductive inorganic composition that included 5 g of Ag NP that was the inorganic metal particle and had the particle diameter of 30 nm, 3.5 g of propylene glycol propyl ether as the solvent, 1.25 g of ethylene glycol, and 0.25 g of glycerol was manufactured, and discharged on the glass substrate by using the ink method. The manufactured conductive inorganic composition was discharged once more on the inorganic pattern that was formed after the discharged conductive inorganic composition was dried, and sintered at 175° C. for 1 hour to manufacture the board that included the conductive pattern.

The resistance of the manufactured board that included the conductive pattern was measured through the 4-point probe, and the result was 343Ω which is higher than the resistance of the board that included the conductive pattern manufactured in Example 1 by about two times.

Comparative Example 2

The conductive organic composition that included 4 g of the Ag nanodecanoate as the organic metal complex and 6 g of xylene as the solvent was manufactured, and discharged on the glass substrate by using the inkjet method. The manufactured conductive organic composition was discharged once more on the organic pattern that was formed after the discharged conductive organic composition was dried, and sintered at 175° C. for 1 hour to manufacture the board that included the conductive pattern.

The resistance of the manufactured board that included the conductive pattern was measured through the 4-point probe, and the result was 349Ω which is higher than the resistance of the board that included the conductive pattern manufactured in Example 1 by about two times.

Comparative Example 3

The conductive organic composition that included 4 g of the Ag nanodecanoate as the organic metal complex and 6 g of xylene as the solvent was manufactured, and discharged on the glass substrate by using the inkjet method. The conductive inorganic composition that included 5 g of Ag NP (nanoparticle) that was the inorganic metal particle and had the particle diameter of 30 nm, 3.5 g of propylene glycol propyl ether as the solvent, 1.25 g of ethylene glycol, and 0.25 g of glycerol was manufactured, and discharged on the organic pattern by using the ink method. After that, it was sintered at 175° C. for 1 hour, thereby manufacturing the board that included the conductive pattern including the conductive inorganic material and the conductive organic material.

The resistance of the manufactured board that included the conductive pattern was measured through the 4-point probe, and the result was 345Ω which is higher than the resistance of the board that included the conductive pattern manufactured in Example 1 by about two times.

Because the board that included the conductive pattern manufactured in Comparative Example 3 does not provide a conductive channel between a conductive inorganic metal particle by conductive organic metal complex, The resistance of the board that included the conductive pattern manufactured in Comparative Example 3 was higher than the resistance of the board that included the conductive pattern manufactured in Example 1.

Comparative Example 4

The conductive organic composition and the conductive inorganic are mixed following the manufacture of the conductive organic composition that included 4 g of the Ag nanodecanoate as the organic metal complex and 6 g of xylene as the solvent and the conductive inorganic composition that included 5 g of Ag NP (nanoparticle) having the particle diameter of 30 nm as the inorganic metal particle, 3.5 g of propylene glycol propyl ether as the solvent, 1.25 g of ethylene glycol, and 0.25 g of glycerol.

However, the manufacture of a ink for inkjet is impossible due to the poor dispersibility of the organic metal complex and inorganic metal particle.

What is claimed is:

1. A method for manufacturing a board that includes a conductive pattern, the method comprising the steps of:
   1) discharging a conductive inorganic composition that includes conductive inorganic metal particles onto a substrate;
   2) discharging a conductive organic composition that includes a conductive organic metal complex onto the conductive inorganic composition; and
   3) sintering the conductive inorganic composition and the conductive organic composition to produce the conductive pattern,
   wherein the conductive pattern comprises the conductive inorganic metal particles and the organic metal complex,
   wherein the organic metal complex in the conductive pattern provides a conductive channel between at least a portion of the conductive inorganic metal particles,
   wherein an organic material excluding a solvent, a dispersing agent and a surfactant is not discharged during the discharging of the conductive inorganic composition in step 1), and
   wherein the conductive inorganic metal particles are not discharged during the discharging of the conductive organic composition in step 2),
   wherein the conductive inorganic metal particles have a particle diameter of 100 nm or less, and
   wherein the conductive organic metal complex includes at least one organic metal complex selected from the group consisting of Ag neodecanoate, Ag neotetradecanoate, and Ag neohexadecanoate.

2. The method for manufacturing the board as set forth in claim 1, wherein the substrate is a glass substrate, a transparent polymer substrate or a flexible substrate.

3. The method for manufacturing the board as set forth in claim 1, wherein the conductive inorganic metal particles include at least one metal selected from the group consisting of Ag, Au, Pt, Ni, Pd, and Cu.

4. The method for manufacturing the board as set forth in claim 1, wherein the content of the conductive inorganic metal particle is in the range of 10 to 90 wt % on the basis of the total weight of the conductive inorganic composition.

5. The method for manufacturing the board as set forth in claim 1, wherein the content of the conductive organic metal complex is in the range of 10 to 90 wt % on the basis of the total weight of the conductive organic composition.

6. The method for manufacturing the board as set forth in claim 1, wherein the discharging of the conductive inorganic composition and the conductive organic composition is carried out by using an inkjet method.

7. The method for manufacturing the board as set forth in claim 1, wherein the sintering in step 3) is carried out at 250° C. or less for 1 to 120 min.

8. The method for manufacturing the board as set forth in claim 1, further comprising drying the conductive inorganic composition that is discharged in step 1) before carrying out step 2).

9. The method for manufacturing the board as set forth in claim 8, wherein the drying is carried out at 100 to 150° C. or less for 10 to 60 min.

10. The method for manufacturing the board as set forth in claim 1, further comprising drying the conductive organic composition that is discharged in step 2) before carrying out the sintering in step 3).

11. The method for manufacturing the board as set forth in claim 10, wherein the drying is carried out at 25 to 100° C. or less for 5 to 30 min.

* * * * *